US012518989B2

(12) United States Patent
Koh et al.

(10) Patent No.: US 12,518,989 B2
(45) Date of Patent: Jan. 6, 2026

(54) IN-SITU CALIBRATION/OPTIMIZATION OF EMISSIVITY SETTINGS IN VACUUM FOR TEMPERATURE MEASUREMENT

(71) Applicant: Applied Materials, Inc., Santa Clara, CA (US)

(72) Inventors: Tuck Foong Koh, Singapore (SG); Ananthkrishna Jupudi, Singapore (SG); Prashant Agarwal, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 947 days.

(21) Appl. No.: 17/483,085

(22) Filed: Sep. 23, 2021

(65) Prior Publication Data
US 2023/0086151 A1 Mar. 23, 2023

(51) Int. Cl.
*H01L 21/67* (2006.01)
*H01J 37/32* (2006.01)
*H01L 21/66* (2006.01)

(52) U.S. Cl.
CPC .. *H01L 21/67248* (2013.01); *H01J 37/32522* (2013.01); *H01L 22/20* (2013.01)

(58) Field of Classification Search
CPC .............. H01L 21/67248; H01L 22/20; H01L 21/67103; H01L 21/68742; H01L 22/12; H01J 37/32522
See application file for complete search history.

(56) References Cited

U.S. PATENT DOCUMENTS

| 4,820,377 | A | 4/1989 | Davis et al. |
| 8,129,682 | B2 | 3/2012 | Meinel et al. |
| 8,449,177 | B2 | 5/2013 | Kvisteroy et al. |
| 9,772,629 | B2 | 9/2017 | Mohammed et al. |
| 2001/0010309 | A1 | 8/2001 | Van Bilsen |
| 2003/0236642 | A1 | 12/2003 | Timans |
| 2010/0054720 | A1* | 3/2010 | Hunter .............. H01L 21/67248 392/416 |
| 2012/0008925 | A1 | 1/2012 | Yoshimoto et al. |
| 2015/0371881 | A1 | 12/2015 | Du Bois et al. |
| 2018/0226282 | A1* | 8/2018 | Hoi ....................... G01J 5/0007 |
| 2018/0364127 | A1 | 12/2018 | Kornelsen et al. |
| 2020/0395233 | A1 | 12/2020 | Strassner et al. |

FOREIGN PATENT DOCUMENTS

JP 4797358 B2 10/2011

OTHER PUBLICATIONS

PCT International Search Report and Written Opinion for PCT/US2022/074234 dated Nov. 16, 2022.

* cited by examiner

*Primary Examiner* — John E Breene
*Assistant Examiner* — Janice M Soto
(74) *Attorney, Agent, or Firm* — Moser Taboada

(57) ABSTRACT

Methods and apparatus for processing a substrate are provided herein. For example, a method for processing a substrate comprises performing a first vacuum processing procedure on a substrate, obtaining temperature measurements of the substrate from a vacuum thermocouple, obtaining temperature measurements of the substrate from a non-contact infrared sensor, calibrating the non-contact infrared sensor based on the temperature measurements from the vacuum thermocouple and the temperature measurements from the non-contact infrared sensor, and performing a second vacuum processing procedure on the substrate using the calibrated non-contact infrared sensor.

17 Claims, 2 Drawing Sheets

IN-SITU CALIBRATION/OPTIMIZATION OF EMISSIVITY SETTINGS IN VACUUM FOR TEMPERATURE MEASUREMENT

FIELD

Embodiments of the disclosure generally relate to methods and apparatus for processing substrates. More particularly, embodiments of the disclosure relate to in-situ calibration/optimization of emissivity settings in vacuum for temperature measurement.

BACKGROUND

Substrate (wafer) fabrication can include one or more processes. For example, substrate fabrication can include using one or more deposition processes (e.g., physical vapor deposition (PVD), chemical vapor deposition (CVP), atomic layer deposition (ALD), etc.), one or more etch processes (e.g., wet etch, dry etch, etc.), degas processes, and one or more polishing processes (e.g., chemical mechanical polishing (CMP) or other suitable polishing processes).

Temperature measurement in a vacuum is challenging due to a lack of a conduction/convection medium. Conventional methods and apparatus utilize non-contact infrared (NC-IR) sensors. For example, in degas processes, which usually operate in high vacuum, temperature measurement and control rely on NC-IR sensors. However, such sensors are emissivity-dependent, and thus material dependent. As such, iterative manual calibrations using, for example, temperature stickers need to be performed prior to degas processing different substrate materials.

SUMMARY

Methods and apparatus for processing a substrate are provided herein. In some embodiments, a method for processing a substrate comprises performing a first vacuum processing procedure on a substrate, obtaining temperature measurements of the substrate from a vacuum thermocouple, obtaining temperature measurements of the substrate from a non-contact infrared sensor, calibrating the non-contact infrared sensor based on the temperature measurements from the vacuum thermocouple and the temperature measurements from the non-contact infrared sensor, and performing a second vacuum processing procedure on the substrate using the calibrated non-contact infrared sensor.

In accordance with at least some embodiments, a non-transitory computer readable storage medium has stored thereon instructions that when executed by a processor perform a method for processing a substrate comprising performing a first vacuum processing procedure on a substrate, obtaining temperature measurements of the substrate from a vacuum thermocouple, obtaining temperature measurements of the substrate from a non-contact infrared sensor, calibrating the non-contact infrared sensor based on the temperature measurements from the vacuum thermocouple and the temperature measurements from the non-contact infrared sensor, and performing a second vacuum processing procedure on the substrate using the calibrated non-contact infrared sensor.

In accordance with at least some embodiments, a vacuum processing chamber comprises a substrate support disposed in an inner volume of the vacuum processing chamber and configured to support a substrate during processing, a gas supply that is configured to supply a process gas to the inner volume, a vacuum thermocouple that is configured to obtain temperature measurements of the substrate during a first vacuum processing procedure, a non-contact infrared sensor that is configured to obtain temperature measurements of the substrate during the first vacuum processing procedure, and a controller that is configured to calibrate the non-contact infrared sensor based on the temperature measurements from the vacuum thermocouple and the temperature measurements from the non-contact infrared sensor and perform a second vacuum processing procedure on the substrate using the calibrated non-contact infrared sensor.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
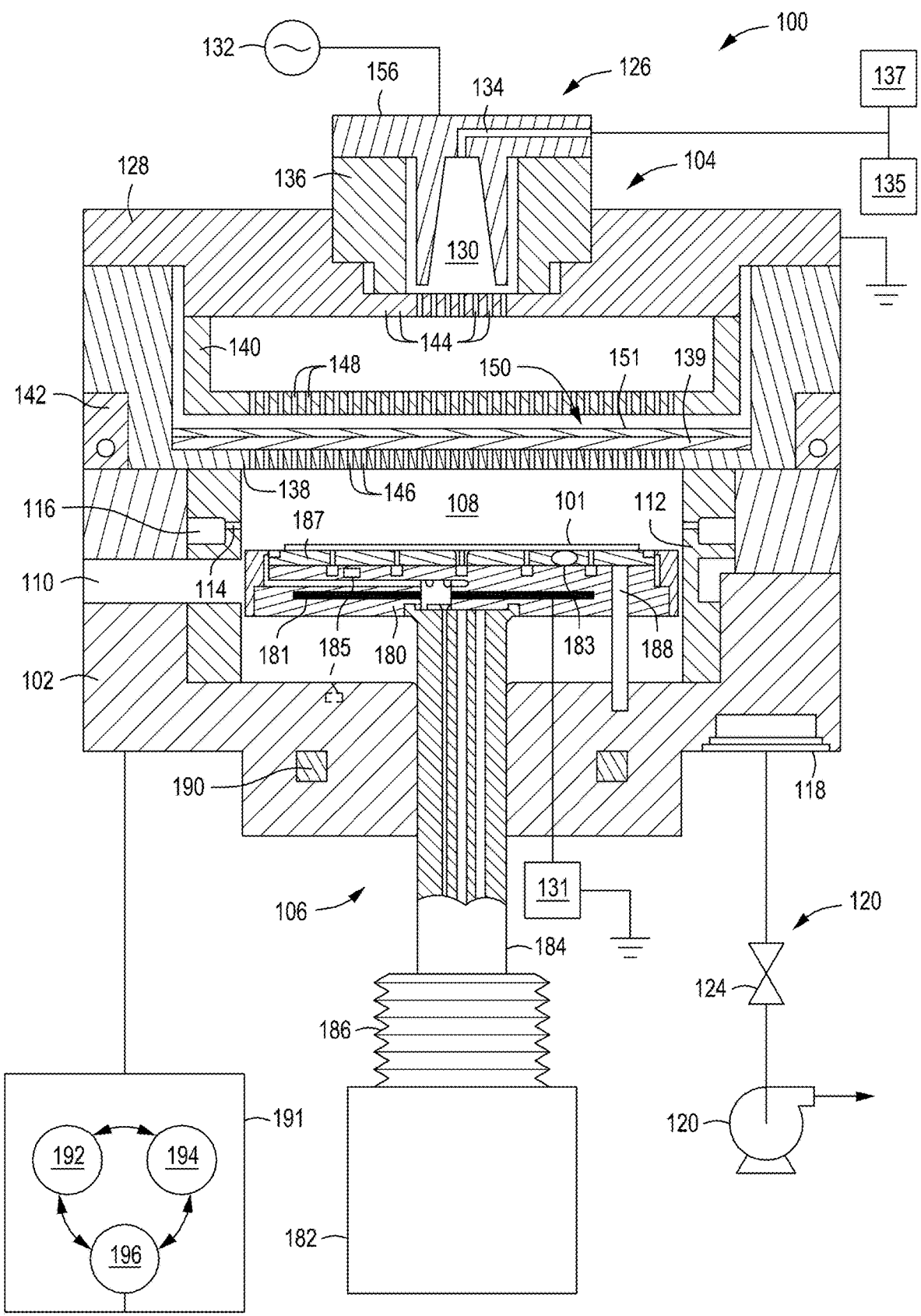
FIG. 1 is a partial cross-sectional view of a vacuum processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatuses for processing substrates are provided herein. For example, apparatus can comprise an NC-IR sensor that is mounted to a bottom of an interior of a processing chamber, e.g., a vacuum environment, and serves as main monitoring sensor. A vacuum thermocouple can be disposed on or coupled to a substrate support and placed close (e.g., adjacent) to a substrate surface. In addition, a spring mechanism can be placed underneath the vacuum thermocouple to apply upward pressure. Both an NC-IR sensor signal and TC signal are logged onto software, and based on the software analysis, a temperature disparity of different substrates can be calculated and optimized for different substrate types. Unlike conventional methods and apparatus, the methods and apparatus described herein increase efficiency, as the in-situ temperate measurements require less time than having to perform iterations with temperature stickers, reduce costs, as there is no need to use temperature stickers, and provide flexibility of choices of substrates.

FIG. 1 is a schematic cross-sectional view of a vacuum processing chamber (processing chamber 100) for processing a substrate, in accordance with at least some embodiments of the present disclosure. Examples of suitable vacuum processing chambers for incorporation of the apparatuses described herein include physical vapor deposition (PVD) chambers, chemical vapor deposition (CVD) deposition chambers, degas chambers, etc., all of which are available from Applied Materials, Inc., of Santa Clara, California. The following processing chamber description is provided for context and exemplary purposes and should not be interpreted or construed as limiting the scope of the disclosure. For illustrative purposes, the processing chamber 100 is described herein as a CVD chamber also capable of performing a degas process.

The processing chamber 100 includes a chamber body 102, a lid assembly 104, and a support assembly 106. The lid assembly 104 is positioned at an upper end of the chamber body 102. The support assembly 106 is disposed in an inner volume 108, defined by the chamber body 102. The chamber body 102 includes a slit valve opening 110 formed in a sidewall thereof. The slit valve opening 110 is selectively opened and closed to allow access to the inner volume 108 by a substrate handling robot (not shown) for substrate transfer.

The chamber body 102 may further include a liner 112 that surrounds the support assembly 106. The liner 112 may be made of a metal such as (Al), a ceramic material, or any other process compatible material. In one or more embodiments, the liner 112 includes one or more apertures 114 and a pumping channel 116 formed therein that is in fluid communication with a vacuum port 118. The apertures 114 provide a flow path for gases into the pumping channel 116. The pumping channel 116 provides an egress for the gases within the processing chamber 100 to the vacuum port 118.

A pressure system 120 can be configured to maintain a desired pressure inside the processing chamber 100 and configured to exhaust (e.g., pumping down) the inner volume 108 of the processing chamber 100. For example, in at least some embodiments, the vacuum port 118 can be coupled to a pump 122 via a valve 124 for exhausting the inner volume 108 of the processing chamber 100 and maintaining a desired pressure inside the processing chamber 100, e.g., maintaining a relatively high pressure during a cleaning process and a relatively low pressure (e.g., vacuum) during substrate processing, or vice versa.

The lid assembly 104 includes at least two stacked components configured to form a plasma volume or cavity therebetween. In one or more embodiments, the lid assembly 104 includes a first electrode ("upper electrode") 126 disposed vertically above a second electrode ("lower electrode") 128. The first electrode 126 and the second electrode 128 confine a plasma cavity 130, therebetween. The first electrode 126 is coupled to a power source 132, such as an RF power supply. The second electrode 128 is connected to ground, forming a capacitor between the first electrode 126 and second electrode 128. The first electrode 126 is in fluid communication with a gas inlet 134 that is connected to a gas supply 135, which provides gas, which can be energized to create an active process gas (e.g., ionized plasma or radicals), to the processing chamber 100 via the gas inlet 134 for performing one or more processes (e.g., deposition process, etch process, cleaning process, etc.). The first end of the one or more gas inlets 134 opens into the plasma cavity 130.

Alternatively or additionally, the gas supply 135 can be coupled to a remote plasma source (RPS) 137 that is configured to supply the plasma or radicals, depending on the configuration of the RPS, to the plasma cavity 130 of the processing chamber 100.

The lid assembly 104 may also include an isolator ring 136 that electrically isolates the first electrode 126 from the second electrode 128. The isolator ring 136 may be made from aluminum oxide (AlO) or any other insulative, processing compatible, material.

The lid assembly 104 may also include showerhead 150 and, optionally, a blocker plate 140. The showerhead 150 includes a gas distribution plate 138, a backing (gas) plate 139, and a chill plate 151. The second electrode 128, the gas distribution plate 138, the chill plate 151, and the blocker plate 140 may be stacked and disposed on a lid rim 142, which is coupled to the chamber body 102 and can function as a temperature-control ring, as described in more detail below.

The chill plate 151 is configured to regulate a temperature of the gas distribution plate 138 during processing. For example, the chill plate 151 may include one or more temperature control channels (not shown) formed therethrough such that a temperature control fluid may be provided therein to regulate the temperature of the gas distribution plate 138.

The second electrode 128 may include a plurality of gas passages 144 formed beneath the plasma cavity 130 to allow gas from the plasma cavity 130 to flow therethrough. The backing gas plate 139 may include one of more gas passages (not shown) and one or more gas delivery channels (not shown), thus allowing gas to flow from the one or more gas passages 217 and into the processing region. Similarly, the gas distribution plate 138 includes a plurality of apertures 146 configured to distribute the flow of gases therethrough. The blocker plate 140 may optionally be disposed between the second electrode 128 and the gas distribution plate 138. The blocker plate 140 includes a plurality of apertures 148 to provide a plurality of gas passages from the second electrode 128 to the gas distribution plate 138.

The support assembly 106 may include a support member 180 (e.g., a substrate support). The support member 180 is configured to support a substrate 101 (e.g., an epoxy substrate, a glass substrate, or a silicon substrate) for processing. The support member 180 may be coupled to a lift mechanism 182 through a shaft 184, which extends through a bottom surface of the chamber body 102. The lift mechanism 182 may be flexibly sealed to the chamber body 102 by a bellows 186 that prevents vacuum leakage from around the shaft 184. The lift mechanism 182 allows the support member 180 to be moved vertically within the chamber body 102 between a lower transfer portion and a number of raised process positions. For example, in at least some embodiments, the lift mechanism 182 is configured to position a substrate support surface 187 of the support member 180 from a substrate processing position a first distance away from the showerhead 150 to, for example, a cleaning position a second distance away from the showerhead 150, wherein the second distance is less than the first distance. Additionally, one or more lift pins 188 may be disposed through the support member 180 and coupled to a bottom surface of the substrate support surface 187. The one or more lift pins 188 are configured to extend through the support member 180 such that the substrate 101 may be raised off the surface of the support member 180. The one or more lift pins 188 may be active by a lift ring 190.

A vacuum thermocouple 183 is disposed on the support member 180. For example, in at least some embodiments, the vacuum thermocouple 183 can be disposed on the support member 180 beneath the substrate support surface 187 adjacent to the substrate 101. In at least some embodiments, the vacuum thermocouple 183 can be operably coupled (attached) to the support member 180 via one or more coupling methods or apparatus, e.g., adhesives, bonding processes, fasteners, etc. The vacuum thermocouple 183 is configured to obtain temperature measurements of the substrate 101 during a first vacuum processing procedure, as will be described in greater detail below. The vacuum thermocouple 183 may be any suitable vacuum thermocouple capable of obtaining the measurements during one or more vacuum processing procedures, e.g., a degas process. For example, in at least some embodiments, the vacuum thermocouple 183 can be a contact-based optic fiber vacuum thermocouple, e.g., such as the one available from Omega™ company. In at least some embodiments, a spring mechanism is disposed beneath the vacuum thermocouple 183 and is configured to apply an upward pressure to the vacuum thermocouple 183 to facilitate obtaining the temperature measurements from the vacuum thermocouple 183.

Additionally, a non-contact infrared sensor 185 is operably coupled to the support member 180. For example, the non-contact infrared sensor 185 can be disposed within the support member 180. In at least some embodiments, the non-contact infrared sensor 185 can be disposed/mounted within a cavity (not shown) underneath the substrate support surface. Alternatively or additionally, the non-contact infrared sensor 185 can be disposed/mounted within a cavity (not shown) underneath a floor of the chamber body 102 (shown in phantom) An aperture, slit, or hole (not shown) may be provided to provide a direct line-of-sight so that the non-contact infrared sensor 185 can obtain temperature measurements of the substrate 101 during the first vacuum processing procedure, as will be described in greater detail below. In at least some embodiments, a cover (e.g., glass) can be provided over the aperture, slit, or hole to protect the non-contact infrared sensor 185 during operation. The non-contact infrared sensor 185 may be any suitable non-contact infrared sensor capable of obtaining the measurements during one or more vacuum processing procedures, e.g., a degas process. For example, in at least some embodiments, the non-contact infrared sensor 185 can be the TEEMAP non-contact infrared sensor available from Wilmington Infrared Technologies.

A heater 181 (e.g., one or more heating electrodes) can be provided in the support assembly 106 and can be configured to heat the support assembly 106 (e.g., to heat the substrate 101 during processing thereof and/or during a cleaning process of the showerhead 150). The heater 181 is coupled to a DC power source 131 to heat the support assembly 106 to a predetermined temperature, e.g., to heat the substrate 101 and/or the showerhead 150.

The processing chamber may also include a controller 191. The controller 191 includes a central processing unit 192 (programmable) that is operable with a memory 194 and a mass storage device, an input control unit, and a display unit (not shown), such as power supplies, clocks, cache, input/output (I/O) circuits, and the liner 112, coupled to the various components of the processing system to facilitate control of the substrate processing. The controller 191 is coupled to the vacuum thermocouple 183 and the non-contact infrared sensor 185 via a wired or wireless connection.

The controller 191 is configured to calibrate the non-contact infrared sensor 185. For example, in at least some embodiments, the controller 191 calibrates the non-contact infrared sensor 185 based on the temperature measurements from the vacuum thermocouple 183 and the temperature measurements from the non-contact infrared sensor. Once the non-contact infrared sensor 185 is calibrated, the controller 191 is configured to perform a second vacuum processing procedure on the substrate 101 using the calibrated non-contact infrared sensor and/or the vacuum thermocouple 183, as will be described in greater detail below.

In at least some embodiments, the second vacuum processing procedure uses only the calibrated non-contact infrared sensor 185.

In at least some embodiments, the controller 191 is further configured to monitor the temperature measurements from the vacuum thermocouple 183 and the temperature measurements from the non-contact infrared sensor 185 until the temperature measurements from the vacuum thermocouple 183 and the temperature measurements from the non-contact infrared sensor 185 are equal to each other for a predetermined amount of time. For example, in at least some embodiments, the predetermined amount of time is about 1600 seconds to about 1650 seconds.

To facilitate control of the processing chamber 100 described above, the central processing unit 192 may be one of any form of general-purpose computer processor that can be used in an industrial setting, such as a programmable logic controller (PLC), for controlling various chambers and sub-processors. The memory 194 coupled to the central processing unit 192 and the memory 194 can be non-transitory computer readable storage medium and may be one or more of readily available memory such as random access memory (RAM), read only memory (ROM), floppy disk drive, hard disk, or any other form of digital storage, local or remote. Support circuits 196 are coupled to the central processing unit 192 for supporting the processor in a conventional manner. Charged species generation, heating, and other processes are generally stored in the memory 194, typically as software routine. The software routine may also be stored and/or executed by a second central processing unit (not shown) that is remotely located from the processing chamber 100 being controlled by the central processing unit 192.

The memory 194 is in the form of computer-readable storage media that contains instructions, that when executed by the central processing unit 192, facilitates the operation of the processing chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein), Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Figure 2:
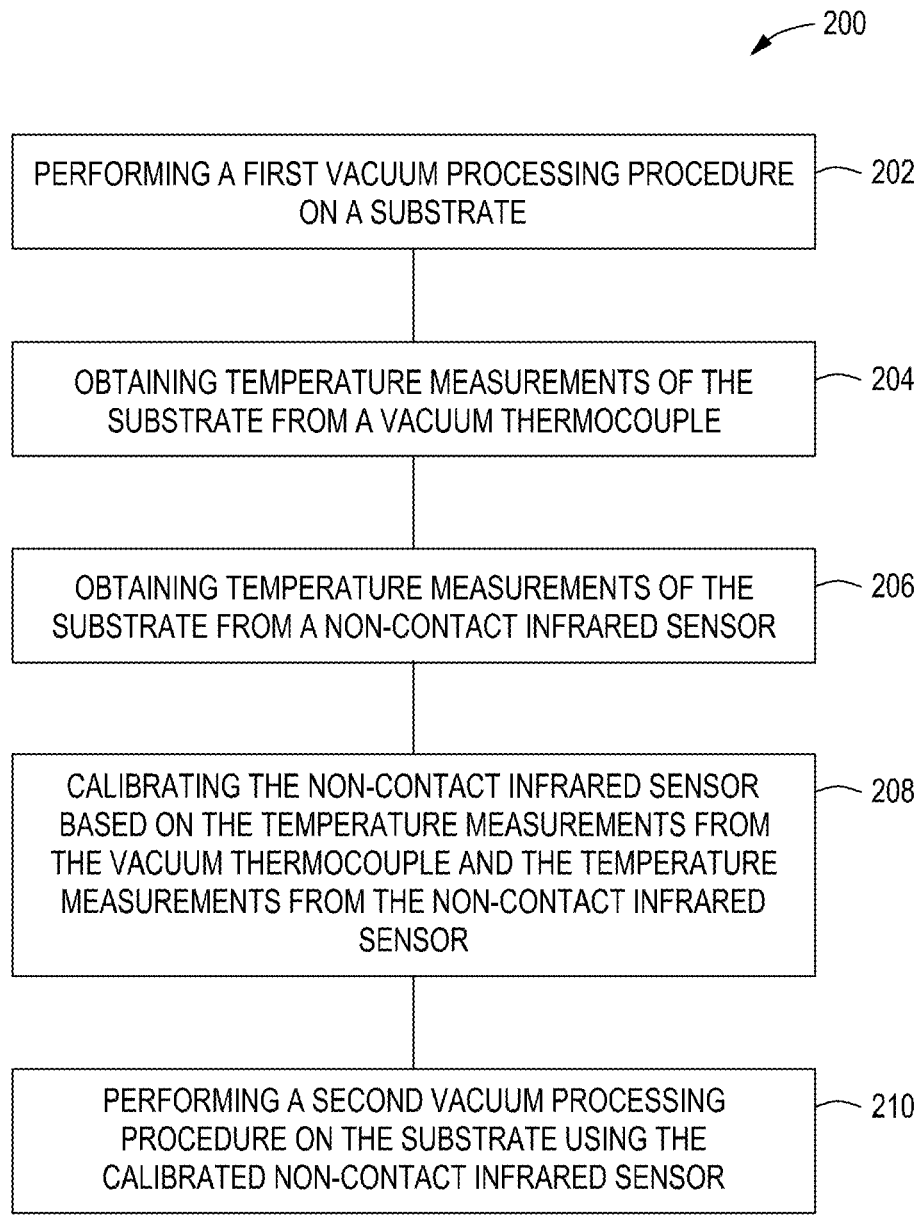
FIG. 2 is a flowchart of a method of processing a substrate using the vacuum processing apparatus of FIG. 1, in accordance with at least some embodiments of the present disclosure.

FIG. 2 is a flowchart of a method 200 of processing a substrate (e.g., the substrate 101, which can be an epoxy substrate, a glass substrate, or a silicon substrate) using the processing chamber 100 of FIG. 1, in accordance with at least some embodiments of the present disclosure.

For example, in at least some embodiments, the method 200 can be used to perform one or more CVD processes on a substrate e.g., a CVD tungsten (W) process. Before or after the CVD process, a degas process can be performed. As noted above, however, temperature measurements in a vacuum can be challenging due to a lack of a conduction/convection medium, e.g., degas processes, which usually operate in high vacuum. Thus, as noted above, both the vacuum thermocouple 183 signals and the non-contact infrared sensor 185 signals can be logged onto software stored in memory (e.g., memory 194), and based on the software analysis performed by the controller 191, a temperature disparity of different substrates can be calculated and optimized for different substrate types.

For example, at 202, the method 200 comprises performing a first vacuum processing procedure on a substrate. For example, in at least some embodiments, after a CVD process is performed, a first degas procedure can be performed.

Next, at 204, the method 200 comprises obtaining temperature measurements of the substrate from a vacuum thermocouple (e.g., the vacuum thermocouple 183). For example, at 204, the controller 191 receives temperature measurements transmitted from the vacuum thermocouple 183 and stores the received temperature measurements in memory 194. In at least some embodiments, the temperature measurements can be about 20° C. to about 180° C.

Next, at 206, the method 200 comprises obtaining temperature measurements of the substrate from a non-contact infrared sensor (e.g., the non-contact infrared sensor 185). For example, at 206, the controller 191 receives temperature measurements transmitted from the non-contact infrared sensor 185 and stores the received temperature measurements in memory 194, In at least some embodiments, the temperature measurements can be about 90° C. to about 180° C.

Next, at 208, the method 200 comprises calibrating the non-contact infrared sensor based on the temperature measurements from the vacuum thermocouple and the temperature measurements from the non-contact infrared sensor. For example, in at least some embodiments, calibrating the non-contact infrared sensor comprises monitoring the temperature measurements from the vacuum thermocouple and the temperature measurements from the non-contact infrared sensor until the temperature measurements from the vacuum thermocouple and the temperature measurements from the non-contact infrared sensor are equal to each other (e.g., achieve equilibrium) for a predetermined amount of time. In at least some embodiments, the predetermined amount of time is about 1600 seconds to about 1650 seconds.

Next, at 210, the method 200 comprises performing a second vacuum processing procedure on the substrate using the calibrated non-contact infrared sensor. In at least some embodiments, performing the second vacuum processing procedure uses only the calibrated non-contact infrared sensor. Alternatively or additionally, the vacuum thermocouple can be used in conjunction with the calibrated non-contact infrared sensor while performing the second vacuum processing procedure.

While the foregoing is directed to embodiments of the present disclosure, other and further embodiments of the disclosure may be devised without departing from the basic scope thereof.

What is claimed is:

1. A method for processing a substrate, comprising:
performing a first vacuum processing procedure on a substrate;
obtaining temperature measurements of the substrate from a vacuum thermocouple while also obtaining temperature measurements of the substrate from a non-contact infrared sensor;
calibrating the non-contact infrared sensor based on the temperature measurements from the vacuum thermocouple and the temperature measurements from the non-contact infrared sensor obtained during the first vacuum processing procedure on a substrate; and
performing a second vacuum processing procedure on the substrate using the calibrated non-contact infrared sensor to obtain temperature measurements, wherein calibrating the non-contact infrared sensor comprises monitoring the temperature measurements from the vacuum thermocouple and the temperature measurements from the non-contact infrared sensor until the temperature measurements from the vacuum thermocouple and the temperature measurements from the non-contact infrared sensor are equal to each other for a predetermined amount of time.

2. The method of claim 1, wherein the predetermined amount of time is 1600 seconds to 1650 seconds.

3. The method of claim 1, wherein performing the second vacuum processing procedure uses only the calibrated non-contact infrared sensor.

4. The method of claim 1, wherein the temperature measurements from the vacuum thermocouple are 20° C. to 180° C. and the temperature measurements from the non-contact infrared sensor are 90° C. to 180° C.

5. The method of claim 1, wherein the substrate is one of an epoxy substrate, a glass substrate, or a silicon substrate.

6. The method of claim 1, wherein the non-contact infrared sensor is disposed on a floor of a vacuum processing chamber adjacent to a substrate support and the vacuum thermocouple is disposed on the substrate support adjacent to the substrate.

7. The method of claim 1, wherein a spring mechanism is disposed beneath the vacuum thermocouple and is configured to apply an upward pressure to the vacuum thermocouple to facilitate obtaining the temperature measurements from the vacuum thermocouple.

8. A non-transitory computer readable storage medium having stored thereon instructions that when executed by a processor perform a method for processing a substrate comprising:
performing a first vacuum processing procedure on a substrate;
obtaining temperature measurements from a vacuum thermocouple while also obtaining temperature measurements from a non-contact infrared sensor;
calibrating the non-contact infrared sensor based on the temperature measurements from the vacuum thermocouple and the temperature measurements from the non-contact infrared sensor obtained during the first vacuum processing procedure on a substrate; and
performing a second vacuum processing procedure on the substrate using the calibrated non-contact infrared sensor to obtain temperature measurements, wherein calibrating the non-contact infrared sensor comprises monitoring the temperature measurements from the vacuum thermocouple and the temperature measurements from the non-contact infrared sensor until the temperature measurements from the vacuum thermocouple and the temperature measurements from the non-contact infrared sensor are equal to each other for a predetermined amount of time.

9. The non-transitory computer readable storage medium of claim 8, wherein the predetermined amount of time is 1600 seconds to 1650 seconds.

10. The non-transitory computer readable storage medium of claim 8, wherein performing the second vacuum processing procedure uses only the calibrated non-contact infrared sensor.

11. The non-transitory computer readable storage medium of claim 8, wherein the temperature measurements from the vacuum thermocouple are 20° C. to 180° C. and the temperature measurements from the non-contact infrared sensor are 90° C. to 180° C.

12. The non-transitory computer readable storage medium of claim 8, wherein the substrate is one of an epoxy substrate, a glass substrate, or a silicon substrate.

13. The non-transitory computer readable storage medium of claim 8, wherein the non-contact infrared sensor is disposed on a floor of a vacuum processing chamber adjacent to a substrate support and the vacuum thermocouple is disposed on the substrate support adjacent to the substrate.

14. The non-transitory computer readable storage medium of claim 8, wherein a spring mechanism is disposed beneath the vacuum thermocouple and is configured to apply an upward pressure to the vacuum thermocouple to facilitate obtaining the temperature measurements from the vacuum thermocouple.

15. A vacuum processing chamber, comprising:
a substrate support disposed in an inner volume of the vacuum processing chamber and configured to support a substrate during processing;
a gas supply that is configured to supply a process gas to the inner volume;
a vacuum thermocouple that is configured to obtain temperature measurements of the substrate during a first vacuum processing procedure;
a non-contact infrared sensor that is configured to obtain temperature measurements of the substrate during the first vacuum processing procedure; and
a controller that is configured to perform a first vacuum processing procedure on a substrate;
obtain temperature measurements from a vacuum thermocouple while also obtaining temperature measurements from a non-contact infrared sensor;
calibrate the non-contact infrared sensor based on the temperature measurements from the vacuum thermocouple and the temperature measurements from the non-contact infrared sensor obtained during the first vacuum processing procedure on a substrate; and
perform a second vacuum processing procedure on the substrate using the calibrated non-contact infrared sensor to obtain temperature measurements, wherein calibrating the non-contact infrared sensor comprises monitoring the temperature measurements from the vacuum thermocouple and the temperature measurements from the non-contact infrared sensor until the temperature measurements from the vacuum thermocouple and the temperature measurements from the non-contact infrared sensor are equal to each other for a predetermined amount of time.

16. The vacuum processing chamber of claim 15, wherein the predetermined amount of time is 1600 seconds to 1650 seconds.

17. The vacuum processing chamber of claim 15, wherein the second vacuum processing procedure uses only the calibrated non-contact infrared sensor.

* * * * *